(12) United States Patent
Fodor et al.

(10) Patent No.: US 8,444,926 B2
(45) Date of Patent: May 21, 2013

(54) PROCESSING CHAMBER WITH HEATED CHAMBER LINER

(75) Inventors: Mark A. Fodor, Redwood City, CA (US); Sophia M. Velastegui, Cupertino, CA (US); Bok Hoen Kim, San Jose, CA (US); Dale R. DuBois, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1189 days.

(21) Appl. No.: 11/668,947

(22) Filed: Jan. 30, 2007

(65) Prior Publication Data

US 2008/0178797 A1 Jul. 31, 2008

(51) Int. Cl.
| | |
|---|---|
| *A62D 3/00* | (2007.01) |
| *B01J 19/00* | (2006.01) |
| *C23F 1/00* | (2006.01) |
| *H01L 21/306* | (2006.01) |
| *B05C 11/00* | (2006.01) |
| *C23C 16/00* | (2006.01) |
| *H05B 3/00* | (2006.01) |
| *H05B 11/00* | (2006.01) |

(52) U.S. Cl.
USPC ........ 422/241; 422/199; 156/345.37; 118/75; 118/722; 219/200

(58) Field of Classification Search
USPC 422/241, 199; 156/345.37; 219/200; 118/75, 118/722
See application file for complete search history.

(56) References Cited

U.S. PATENT DOCUMENTS

| | | | |
|---|---|---|---|
| 4,483,737 A | | 11/1984 | Mantei |
| 5,558,783 A | * | 9/1996 | McGuinness .................. 210/761 |
| 5,565,058 A | | 10/1996 | Banholzer et al. |
| 5,616,208 A | | 4/1997 | Lee |
| 5,788,799 A | * | 8/1998 | Steger et al. ............. 156/345.37 |
| 5,824,158 A | | 10/1998 | Takeuchi et al. |
| 5,843,277 A | | 12/1998 | Goto et al. |

(Continued)

FOREIGN PATENT DOCUMENTS

| | | |
|---|---|---|
| DE | 31 10489 A1 | 10/1982 |
| EP | 0 807 953 A1 | 11/1997 |

(Continued)

OTHER PUBLICATIONS

Annotated Figure 3 of Zhao, US 20030051665.*

(Continued)

*Primary Examiner* — Michael Marcheschi
*Assistant Examiner* — Christopher Vandeusen
(74) *Attorney, Agent, or Firm* — Patterson & Sheridan, LLP (57) ABSTRACT

A heater liner assembly suitable for covering the interior of a plasma processing chamber is provided. In some embodiments, a liner assembly for a processing chamber can include a heating element embedded in a body. A flange extending outward from an outer diameter of the body includes an upper surface having a sealing surface and at least one pad that extends from the upper surface of the flange to an elevation beyond the sealing surface. The pad contributes to control of the temperature of the liner assembly by maintaining the liner assembly spaced apart from the processing chamber.

16 Claims, 6 Drawing Sheets

U.S. PATENT DOCUMENTS

| | | | |
|---|---|---|---|
| 5,846,331 A | | 12/1998 | Miyamoto |
| 5,968,276 A | | 10/1999 | Lei et al. |
| 6,007,673 A | | 12/1999 | Kugo et al. |
| 6,030,486 A | | 2/2000 | Loewenhardt et al. |
| 6,063,199 A | * | 5/2000 | Sajoto et al. ............... 118/715 |
| 6,143,078 A | | 11/2000 | Ishikawa et al. |
| 6,167,834 B1 | * | 1/2001 | Wang et al. ............ 118/723 E |
| 6,171,438 B1 | | 1/2001 | Masuda et al. |
| 6,176,198 B1 | | 1/2001 | Kao et al. |
| 6,227,140 B1 | * | 5/2001 | Kennedy et al. .......... 118/723 R |
| 6,273,022 B1 | | 8/2001 | Pu et al. |
| 6,350,320 B1 | * | 2/2002 | Sherstinsky et al. .......... 118/715 |
| 6,432,259 B1 | | 8/2002 | Noorbakhsh et al. |
| 2002/0069970 A1 | | 6/2002 | Noorbakhsh et al. |
| 2003/0051665 A1 | * | 3/2003 | Zhao et al. ............. 118/723 E |
| 2006/0213436 A1 | * | 9/2006 | Ohmi et al. .................. 118/715 |
| 2007/0091535 A1 | | 4/2007 | Noorbakhsh et al. |
| 2007/0107660 A9 | | 5/2007 | Sen et al. |

FOREIGN PATENT DOCUMENTS

| | | | |
|---|---|---|---|
| EP | 0 814 495 A2 | | 12/1997 |
| EP | 0855735 | | 7/1998 |
| EP | 0892422 | | 1/1999 |
| JP | 63005526 | | 1/1988 |
| JP | 09275092 | | 10/1997 |
| JP | 11100673 | | 4/1999 |
| WO | WO 97/08734 | | 3/1997 |
| WO | WO 99/48130 | | 9/1999 |
| WO | WO2005015613 | * | 2/2005 |

OTHER PUBLICATIONS

Annotated figures 3, 4A of Zhao, US20030051665.*

PCT Search Report and Written Opinion for PCT/US 08/51055, dated May 9, 2008, consists of 10 pages.

* cited by examiner

PROCESSING CHAMBER WITH HEATED CHAMBER LINER

BACKGROUND OF THE INVENTION

1. Field of the Invention

Embodiments of the invention generally relate to a semiconductor processing chamber and, more specifically, a liner assembly used in a semiconductor processing chamber.

2. Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower-temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

One problem that has been encountered during plasma processing is the non-uniform temperature distribution in the processing chamber during processing. In certain systems, two opposing electrodes are disposed in the processing chamber defining a processing zone in the central region of the processing chamber. The opposing electrodes are utilized to maintain a plasma in the processing zone. The plasma provides ionization energy as well as thermal energy utilized to process a substrate disposed within the chamber. As the plasma and thermal energy is generally concentrated in the center region of the processing chamber, a temperature gradient between the center and side regions, e.g., the sidewall, of the process chamber is generated.

The temperature variation is aggravated in processing systems having adjacent processing systems or other external heat source that heats one region or side of a chamber more than another. For example, in a processing chamber body having two plasma processing regions separated by a shared internal wall, the internal wall is heated from the plasma from both regions while the external walls are heated by only one of the plasmas, thereby creating an unbalanced heat load which results in the exterior walls having a lower temperature relative to the internal wall. The low temperature may cause process gases or precursors to condense on the wall surfaces having the reduced temperature, thereby resulting in particle generation that may lead to contamination of the deposited film.

Particles generation within the chamber may also accumulate in and eventually obstruct the pumping port, thereby requiring an interruption in processing to clear the pumping port. Additionally, particles within the chamber may compromise chamber seals, thereby resulting in thermal energy loss and further aggravating the temperature uniformity of chamber walls.

Therefore, there is a need for an improved method and apparatus that improves temperature uniformity along the boundary of the processing region.

SUMMARY OF THE INVENTION

Embodiments of the invention provide a heater liner assembly suitable for use in a plasma processing chamber. In some embodiments, a liner assembly for a processing chamber can include a heating element embedded in a body. A flange extending outward from an outer diameter of the body includes an upper surface having a sealing surface and at least one pad that extends from the upper surface of the flange to an elevation beyond the sealing surface.

In some embodiments, a liner assembly for a processing chamber can include a ceramic body having an inner diameter surface bounding a portion of a pumping cavity. A pumping aperture is disposed through the body and fluidly couples to the pumping cavity through the inner diameter surface. A heating element is embedded in the body. A flange extending outward from an outer diameter of the body and has an upper surface. A portion of the upper surface of the flange has a sealing surface. At least one pad extends from the upper surface of the flange to an elevation beyond the sealing surface. At least one thermal choke is defined in the flange. A recess is formed in the upper surface between the sealing surface and the pad. The pad, choke and recess contribute to control of the temperature of the liner assembly.

In yet some other embodiments, a liner assembly for a processing chamber may include an annular ceramic heater liner having at least one embedded heater. The heater liner has a pad configured to minimize contact area with the processing chamber. An annular ceramic pumping liner is disposed adjacent to and radially inward of the heater liner. The pumping liner has a plurality of ports formed therethrough that are configured to allow entry of gases into a pumping cavity defined between the pumping liner and heater liner. A middle liner is disposed adjacent to and radially inward of the heater liner and adjacent to and below of the pumping liner. A tubular sleeve is coupled to the middle liner. The sleeve has a substrate passage formed therethrough to allow passage of a substrate through the liner assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

The liner assembly of the present invention advantageously minimizes heat transfer between the chamber body and the liner assembly. In some embodiments, the liner assembly may be configured to compensate for non-uniform heating of the liner assembly such that the temperature of the liner assembly may be maintained with at a uniform or non-uniform profile.

Embodiments of the present invention are illustratively described below in reference plasma enhanced chemical vapor deposition (PECVD) system. Examples of PECVD systems that may be adapted to benefit from the invention include a PRODUCER® SE CVD system or a DXZ® CVD system, both commercially available from Applied Materials, Inc., Santa Clara, Calif. The Producer® SE CVD system (e.g., 200 mm or 300 mm) has two isolated processing regions that may be used to deposit carbon-doped silicon oxides and other materials and is described in U.S. Pat. Nos. 5,855,681 and 6,495,233, both of which are incorporated by reference. The DXZ® CVD chamber is disclosed in U.S. Pat. No. 6,364,954, which is also incorporated by reference. Although the exemplary embodiment includes two processing regions, it is contemplated that the invention may be used to advantage in systems having a single processing region. It is also contemplated that the invention may be utilized to advantage in other plasma chambers, including etch chambers, ion implantation chambers, plasma treatment chambers, and stripping chambers, among others. It is further contemplated that the invention may be utilized to advantage in plasma processing chambers available from other manufacturers.

Figure 1:
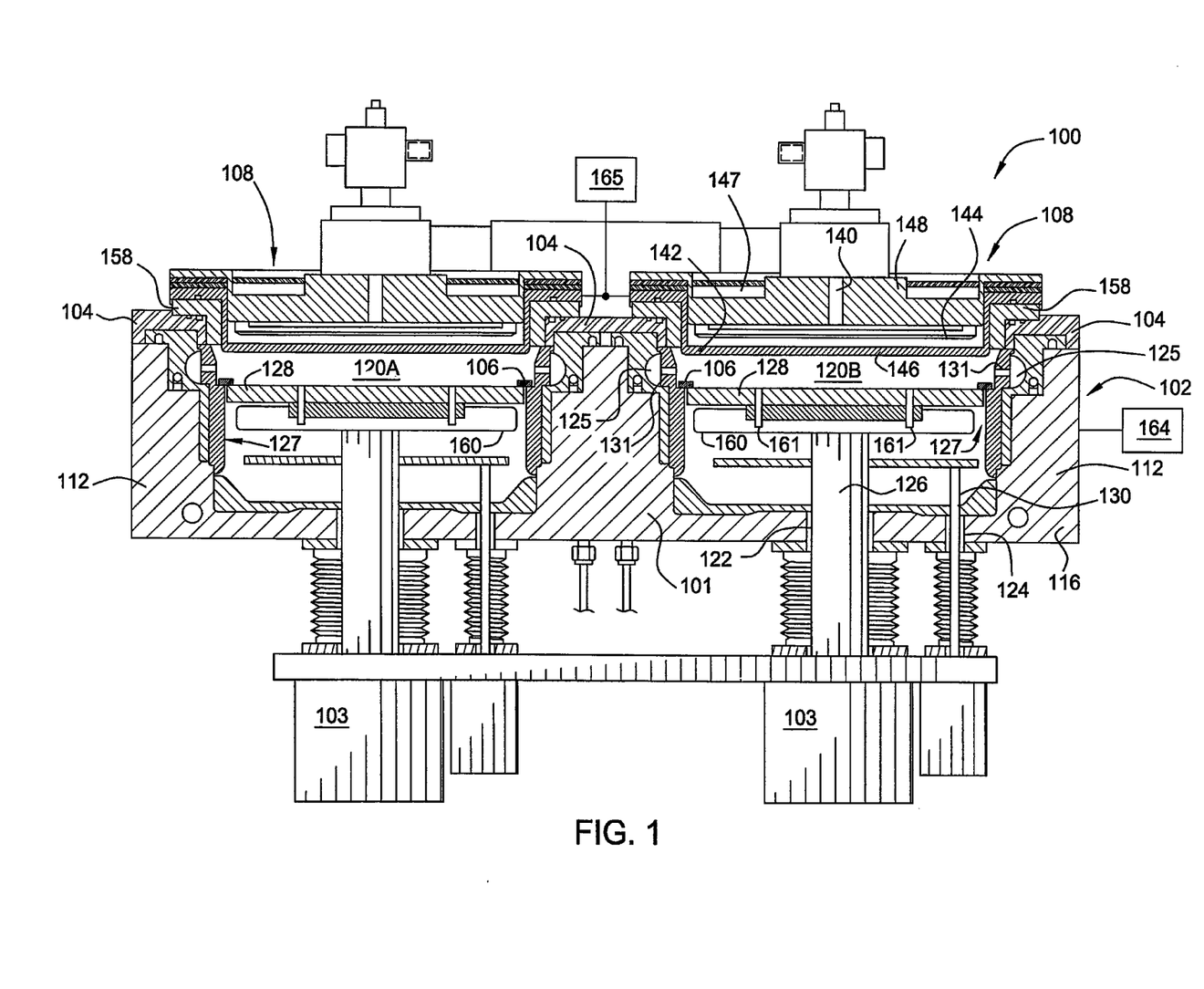
FIG. 1 depicts a sectional view of a PECVD system in accordance with one embodiment of the present invention.

Figure is a partial cross sectional views of a PECVD system 100 having one embodiment of a chamber liner assembly 127 of the present invention. The PECVD system 100 generally comprises a chamber body 102 having sidewalls 112, a bottom wall 116 and an interior wall 101 defining a pair of processing regions 120A-B. Each of the processing regions 120A-B is similarly configured, and for the sake of brevity, only components in the processing region 120B will be described.

A pedestal 128 is disposed in the processing region 120B through a passage 122 formed in the bottom wall 116 in the system 100. The pedestal 128 is adapted to support a substrate (not shown) on the upper surface thereof. The pedestal 128 may include heating elements, for example resistive elements, to heat and control the substrate temperature in a desired process temperature. Alternatively, the pedestal 128 may be heated by a remote heating element, such as a lamp assembly.

The pedestal 128 is coupled by a stem 126 to a drive system 103 that controls the elevation of the pedestal 128 within the processing region 120B. A shadow ring 106 may be disposed on the periphery of the pedestal 128 that engages the substrate at a desired elevation of the pedestal 128.

A rod 130 passing through a passage 124 formed in the bottom wall 116 and is utilized to activate substrate lift pins 161 disposed through the pedestal 128. The substrate lift pins 161 selectively space the substrate from the pedestal to facilitate exchange of the substrate with a robot (not shown) utilized for transferring the substrate into and out of the processing region 120B through a substrate transfer port 160.

A chamber lid 104 is coupled to a top portion of the chamber body 102. The lid 104 accommodates more gas distribution systems 108 disposed therethrough. The gas distribution assembly 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146. A RF (radio frequency) source 165 is coupled to the showerhead assembly 142. The RF source 165 powers the showerhead assembly 142 to facilitate generation of a plasma between the faceplate 146 of the showerhead assembly 142 and the heated pedestal 128. In one embodiment, the RF source 165 may be a high frequency radio frequency (HFRF) power source, e.g., a 13.56 MHz RF generator. In another embodiment, RF source 165 may include a HFRF power source and a low frequency radio frequency (LFRF) power source, e.g. a 300 kHz RF generator. Alternatively, the RF source may be coupled to other portion of the processing chamber 100, such as the pedestal 128, to facilitate plasma generation. A dielectric isolator 158 is disposed between the lid 104 and showerhead assembly 142 to prevent conducting RF power to the lid 104.

Optionally, a cooling channel 147 is formed in the annular base plate 148 of the gas distribution system 108 to cool the annular base plate 148 during operation. A heat transfer fluid, such as water or the like, may be circulated through the cooling channel 147 such that the base plate 148 is maintained at a predefined temperature.

The chamber liner assembly 127 is disposed within the processing region 120B in very close proximity to the sidewalls 101, 112 of the chamber body 102 to prevent exposure sidewalls 101, 112 to the hostile processing environment within the processing region 120B. The liner assembly 127 includes a circumferential pumping cavity 125 that is coupled to a pumping system 164 configured to exhaust gases and byproducts from the processing region 120B and control the pressure within the processing region 120B. A plurality of exhaust ports 131 may be formed on the chamber liner assembly 127. The exhaust ports 131 are configured to allow the flow of gases from the processing region 120B to the circumferential pumping cavity 125 in a manner that promotes processing within the deposition system 100.

Figures 2, 3:
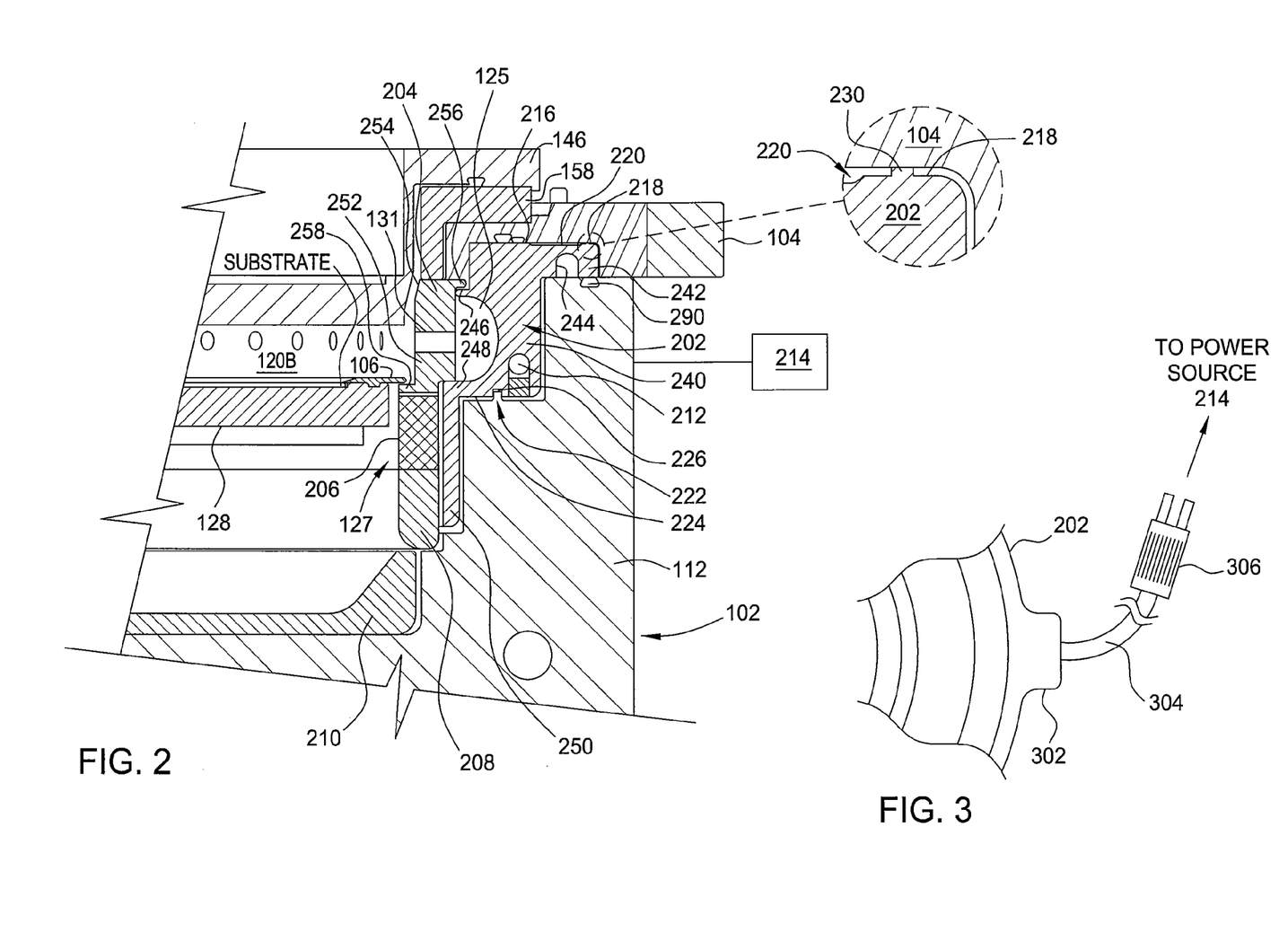
FIG. 2 is a partial sectional view of a portion of the liner assembly depicted in FIG. 1 having a heater liner.
FIG. 3 is a partial top view of a heater liner of FIG. 2.

FIG. 2 is a partial sectional view of a portion of the liner assembly 127 depicted in FIG. 1. The liner assembly 127 is slipped within the interior sidewalls 101, 112 of the chamber body 102 such that the processing region 120B is confined within the liner assembly 127. The liner assembly 127 may be readily removed from the chamber body 102, thereby facilitating the replacement of the liner assembly 127 after a number of processing cycles. The liner assembly 127 is generally sealed to the body 102 via a seal (e.g., o-ring) disposed in a gland 290 formed in the body 102 or liner assembly 127.

In one embodiment, the liner assembly 127 may include a single integral body to each to facilitate installation and removal of the liner assembly from the chamber body. In another embodiment, the liner assembly 127 may include a series of separate liners that may be stacked or abutted together to reduce the effects of thermal expansion during use and/or facilitate installation and removal of the liner assembly 127.

In the embodiment depicted in FIG. 2, the liner assembly 127 includes a heater liner 202, a pumping liner 204, an upper middle liner 206, a lower middle liner 208 and a bottom liner 210. The liners 202, 204, 206, 208 are generally fabricated from ceramic or other suitable material. In one embodiment, the liners 202, 204, 206, 208 may be individually separable to one another and configured to allow relative motion therebetween thus accommodating potential mismatches in thermal expansion during processing, thereby preventing parts cracking or damage. The liners 202, 204, 206, 208 may optionally be interlocked in a manner that provides increased mechanical strength, ease of handling and/or maintains orientation.

The bottom liner 210 may be fabricated from ceramic or aluminum, and is generally configured to cover the bottom 116 of the chamber body 102. In embodiment, the bottom liner 210 is generally dish shaped in form.

The upper middle liner 206 and the lower middle liner 208 generally have an annular form. The upper middle liner 206 may includes a slot, cutout or break that allows a sleeve, coupled to the heater liner 202, to extend into the substrate transfer port 160, as further described below.

The heater liner 202 includes one or more heaters 212. The heater 212 may be a conduit for flowing a heat transfer fluid through the liner 202 or a resistive heating element. In the embodiment depicted in FIG. 2, the heater 212 is a resistive heating element that is coupled to a power supply system 214.

As depicted in the partial top view of the heater liner 202 of FIG. 3, heater leads 304 exit the heater liner 202 from a tab 302 extending from the upper perimeter of the heater liner 202. The leads 304 may include a connector 306 to facilitate the rapid coupling/decoupling from the power supply system 214 during removal/replacement of the liner assembly 127. The power supply system 214 is adapted to controllably heat to the chamber liner 202, thereby allowing the chamber liner 202 to be maintained within a desired temperature range during plasma processing.

The heater 212 may be configured such that one area of the liner 202 has more heating capacity than another area, such that one section of the liner 202 is heated more than another. The difference in heat conducted to the liner 202 from the heater 212 may be utilized to compensate for uneven heating or cooling of the liner 202 from other sources, such that the liner 202 has a uniform temperature profile, or to create a non-uniform liner temperature profile. In another embodiment, the heater 212 controls the temperature of the heater liner 202 between about 100 and about 200 degrees Celsius, although higher temperatures are contemplated when used with seals fabricated from appropriate high temperature materials.

Figure 4A:
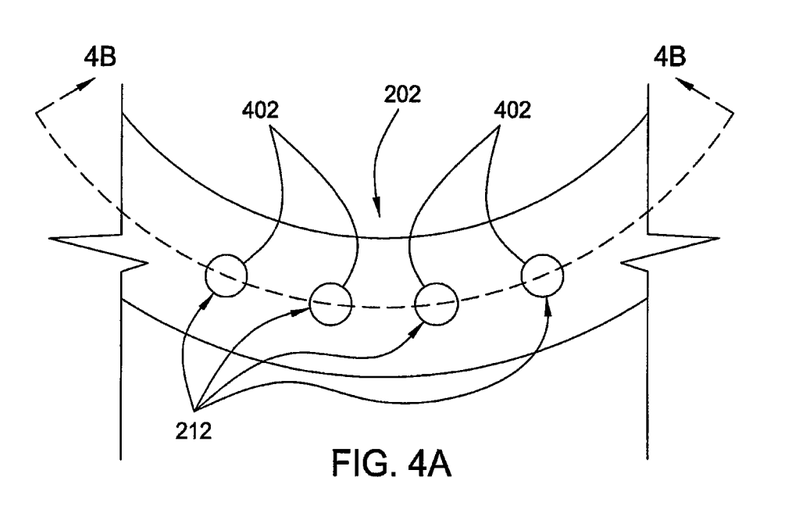
FIGS. 4A-B are partial top and sectional views of another embodiment a heater liner.
Figure 4B:
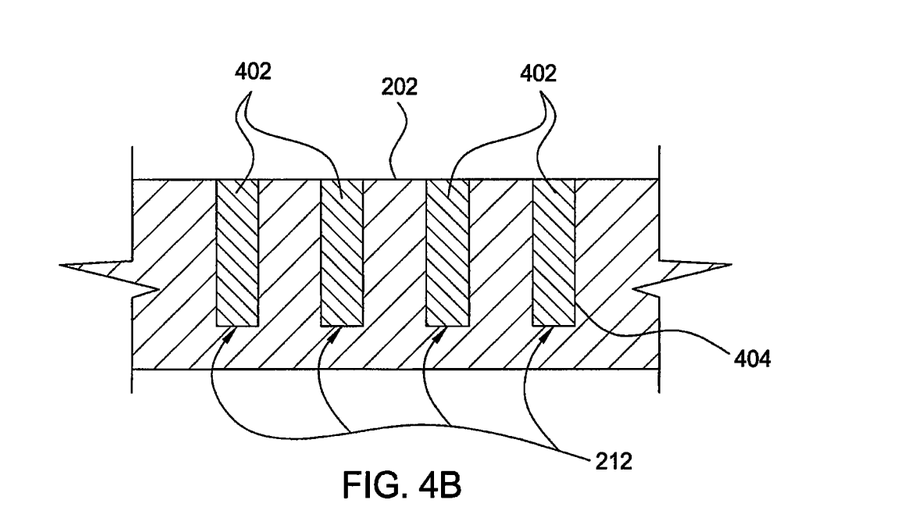

FIGS. 4A-B depict partial top and sectional views of another embodiment of the liner 202. In the embodiment depicted in FIGS. 4A-B, the heater 212 of the liner 202 is comprised of a plurality of heating elements 402, for example, cartridge heaters. The heating elements 402 may be arranged around the perimeter of the liner 202, for example, in holes 404 formed in the liner 202. Each heating element 402 may be individually controlled to produce a predetermined liner temperature profile. In another embodiment, the spacing or heating capacity of the heating elements 402 may be selected to produces a predetermined liner temperature profile. For example, the region of the heater liner 202 above the pumping aperture (shown as 564 in FIG. 5 below) of the pumping liner 204 may has a greater density of heating elements 402 to compensate of the increased heat transfer due to high flows through the aperture as compared to other regions of the liner 202.

Returning to FIG. 2, the heater liner 202 also includes a number of features provided to reduce the conduction of heat between the liner assembly 127 and the chamber body 102. In one embodiment, the heater liner 202 has an upper seal surface 216 that is maintained spaced from the lid 104 by at least one upper contact pad 230. The upper contact pad 230 extends from an upper surface 218 of the heater liner 202 to an elevation that allows for compression of a seal (not shown) disposed between the surface 216 of the liner 202 and lid 104 without physical lid-to-liner contact in the seal region (e.g., the surface 216). A recess 220 is formed in the upper surface 218 to improve thermal isolation between the liner 202 and lid 104. The upper contact pads 230 minimize the contact area between the chamber lid 104 and the chamber liner 202, while the and recess 220 maximizes the heat transfer gap therebetween, thereby reducing the amount of heat transferred between the lid 104 and liner 202.

In one embodiment, eighteen cylindrical contact pads 230 may be provided on the upper surface 218 of the heater liner 202. It is contemplated that the numbers, sides, diameters, shapes, and distributions of the contact pads 230 may be configured in different manner for specific process requirement and chamber design configurations.

An alignment feature provided between the liner 202 and chamber body 102. In one embodiment, alignment feature may be formed as a single element or as a plurality of elements arranged in a polar array disposed on a lower surface 224 of the heater liner 202. Alternatively, the alignment feature may be formed in the portion of the chamber body 102 above which the heater liner 202 is spaced. In the embodiment depicted in FIG. 2, the alignment feature includes a hole 222 and mating insert 226. The insert 226 may be in the form of pins extending between the chamber body 102 and heater liner 202 to maintain these components in a predefined orientation. The pins (e.g., insert 226) may extend from at least one of the chamber body 102 or heater liner 202, and may be fabricated from a material having a lower heat transfer rate than the liner 202.

The heater liner 202 includes a main body 240 having the pumping cavity 125 bounded by its inner diameter. An upper outer flange 242 extends outward from a top of the body 240. A thermal choke 244 is formed in the flange 242 inward of the contact pads 230 to minimize the flow of heat from the body 240 to the pads 230. The choke 224 and reduces contact area of the pads 230 functions to minimize heat loss to the chamber body while protecting the seals (e.g., o-ring, not shown) disposed in the gland 290 from high temperatures which would otherwise potentially damage the o-ring or integrity of the seal.

In one embodiment, the thermal choke 244 is an annular groove is formed in the flange 242. In another embodiment, the thermal choke 244 is a plurality of groove segments formed in the flange 242, for example, seven groove segments. The web of flange material coupling the portions of the flange 242 on either side of the thermal choke 244 may be selected to control the rate of heat passing across the choke 244, and in some embodiments, may be selected such that heat passes at different rates across regions of the choke(s) 244 disposed at various angular positions along of the heater liner 202 so that the control of temperature profile of the liner 202 may be enhanced.

An upper inner flange 246 extends inward from the body 240 above the cavity 125. A lower inner flange 248 extends inward from the body 240 below the cavity 125. A skirt 250 extends downward from the flange 248. In one embodiment, at least one of the flanges 246, 248 support the pumping liner 204 thereon.

The pumping liner 204 includes a main body 252 having the ports 131 formed therethrough, a tapered upper inner section 254, an upper outer lip 256 and an inner lower lip 258. The tapered upper inner section 254 is configured to maintain a gap between the liner assembly 127 and the energized face place 146. The upper outer lip 256 interleaves with the upper inner flange 246 of the heater liner 202, wherein the lower inner lip 258 is configured to support the shadow ring 106 when the pedestal 128 is moved to a lowered position adjacent the transfer port 160.

Figure 5:
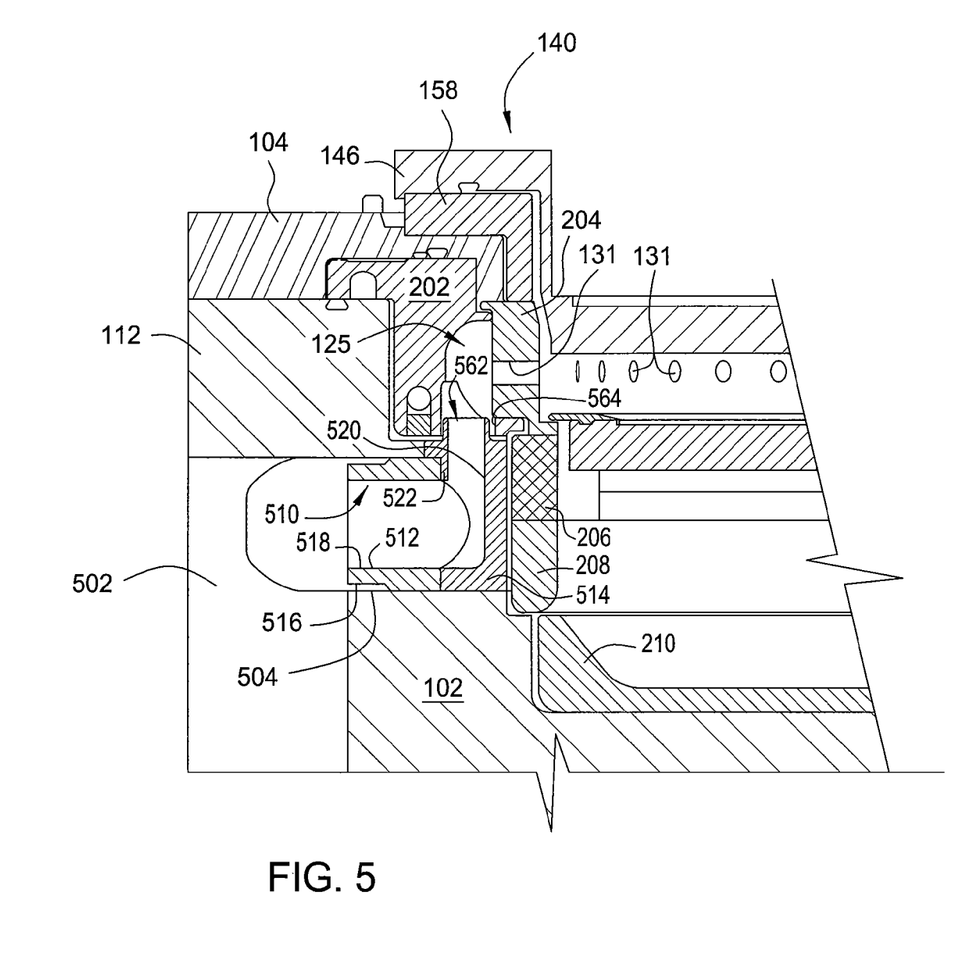
FIG. 5 is another partial sectional view of one embodiment of a port liner.

FIG. 5 is another partial sectional view of the liner assembly 127 illustrating the pumping path out of the pumping cavity 125 defined in the liner assembly 127 into a pumping port 502 formed in the chamber body 102. The heater liner 202 and/or pumping liner 204 of the liner assembly 127 is configured to engage with a port liner 510 that lines a passage extending between the cavity 125 and pumping port 502. The port liner 510 generally includes an insert 512 and a tube 514.

The insert 512 includes a tapered and/or reduced outer diameter 516 that facilitates insertion of the insert 512 into a substantially horizontal passage 504 formed through the body 102 can breaking into the pumping port 502. The tube 514 includes a cut-out 522 that accepts the end of the insert 512 such that the internal passages 518, 520 of the insert 512 and tube 514 form a lined conduit at the mouth of the pumping port 502. The tube 514 also includes a boss 562 that extends into a cavity exhaust port 564 that is formed through the pumping liner 204 and fluidly communicates with the cavity 125 defined therein.

The port liner 510 is installed prior to the remainder of the liner assembly 127. First, the insert 512 is disposed in the horizontal passage 504. The tube 514 is then set on the insert 512 such that the cut-out 522 engages the insert 512 and the passages 518, 520 align. The upper middle liner 206 and the lower middle liner 208 are then installed to hold the port liner 510 in place. The heated and pumping liners 202, 204 may then be disposed on the upper middle liner 206.

Figure 6A:
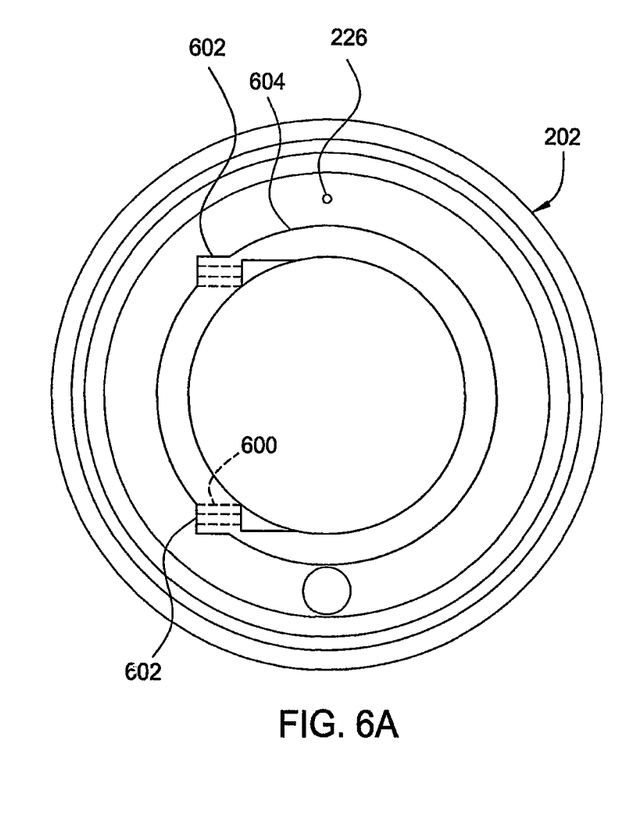
FIGS. 6A-B are bottom and side views of one embodiment of an upper middle liner.
Figure 6B:
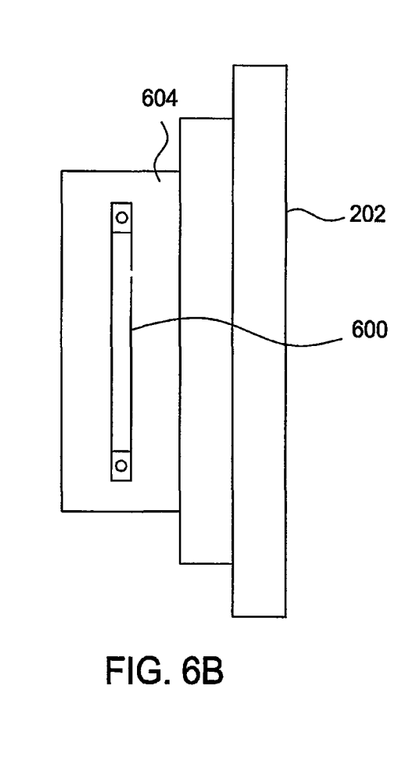
Figure 6C:
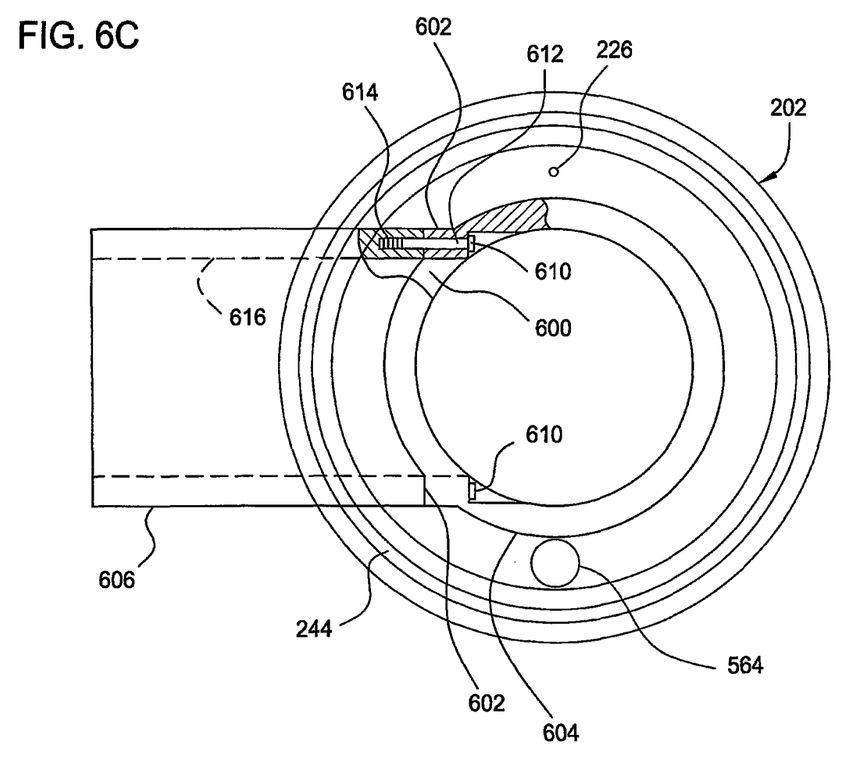
FIG. 6C is a bottom view of a substrate transfer port sleeve coupled to the upper middle liner of FIGS. 7A-B.

FIGS. 6A-B are bottom and side views of one embodiment of the heater liner 202. The heater liner 202 includes a slot 600 that allows passage of the substrate through the chamber liner assembly 127. The slot 600 is generally orientated opposite the tab 302 of the heater liner 202 and orthogonally to the cavity exhaust port 564 formed in the pumping liner 204. An outer diameter 604 of the heater liner 202 adjacent the slot 600 includes two mounting pads 602. The mounting pads 602 facilitate coupling a tubular sleeve 606 to the heater liner 202, as shown in the bottom view of the heater liner 202 and sleeve 606 depicted in FIG. 6C. The heater liner 202 and sleeve 606 may be coupled in any suitable fashion, for example, by fasteners 610 extending through a clearance hole 612 formed through the heater liner 202 and engaged with a threaded hole 614 formed in the sleeve 606. When mated, a substrate passage 616 (shown in phantom) of the sleeve 606 is aligned with the slot 600 of the liner 202 to facilitate substrate transfer through the liner assembly 127. The sleeve 606 is generally first slipped into the substrate transfer port 160 prior to installation to the heater liner 202.

Thus, a heated chamber liner assembly is provided in the present invention. The heated chamber liner provides thermal energy to heat a central processing region, and is substantially isolated from thermal effects of the chamber wall and lid, thereby allowing a predetermined temperature profile of the chamber liner assembly to be realized.

While the foregoing is directed to embodiments of the present invention, other and further embodiments of the invention may be devised without departing from the basic scope thereof, and the scope thereof is determined by the claims that follow.

What is claimed is:

1. A processing chamber, comprising:
  a chamber body having sidewalls, a bottom, and a chamber lid coupled to a top portion of the chamber body, defining one or more processing regions therein; and
  a liner assembly, comprising:
    a liner body removably disposable within the sidewalls of the processing chamber;
    a heater embedded in the liner body;
    a flange extending outward from an outer diameter of the liner body, a portion of an upper surface of the flange forming a sealing surface;
    a recess formed in the upper surface of the flange; and
    a plurality of cylindrical contact pads extending from the upper surface of the flange to an elevation above the sealing surface, wherein each of the plurality of cylindrical contact pads contacts a portion of the chamber lid, and the liner body, the flange and the plurality of cylindrical contact pads integrally forming a unitary heated liner wherein the plurality of cylindrical contact pads minimize a contact area between the chamber lid and the liner assembly.

2. The processing chamber of claim 1, wherein the liner assembly further comprises:
  at least one groove formed in the liner body, wherein the groove is disposed on a side of the liner body opposite to the plurality of cylindrical contact pads.

3. The processing chamber of claim 1, wherein the heater further comprises:
  at least one resistive heating element.

4. The processing chamber of claim 1, wherein the heater is configured to provide greater heating capacity along a first perimeter section of the liner body relative to a second perimeter section.

5. The processing chamber of claim 1, wherein the heater further comprises:
  a plurality of resistive heating elements.

6. The processing chamber of claim 5, wherein the resistive heating elements are arranged in a polar array.

7. The processing chamber of claim 5, wherein the resistive heating elements are disposed more densely in one region relative to another region.

8. The processing chamber of claim 1, wherein an inner diameter surface of the liner body bounds a portion of a pumping cavity.

9. The processing chamber of claim 8, wherein a pumping aperture disposed through the liner body fluidly couples to the pumping cavity through the inner diameter surface.

10. The processing chamber of claim 8 further comprising:
  a pumping liner forming an inner boundary of the pumping cavity.

11. The processing chamber of claim 10, wherein the pumping liner further comprises:
  a plurality of pumping ports formed therethrough and fluidly coupled to the pumping cavity.

12. A processing chamber, comprising:
  a chamber body having sidewalls, a bottom, and a chamber lid coupled to a top portion of the chamber body, defining one or more processing regions therein; and
  a liner assembly, comprising:
    a ceramic body removably disposable within the sidewalls of the processing chamber and having an inner diameter surface bounding a portion of a pumping cavity;
    a pumping aperture disposed through the body and fluidly coupled to the pumping cavity through the inner diameter surface;
    a heater embedded in the body;
    a flange extending outward from an outer diameter of the body, a portion of an upper surface of the flange forming a sealing surface; and
    a plurality of cylindrical contact pads extending from the upper surface of the flange to an elevation above the sealing surface, the body, the flange and the plurality of cylindrical contact pads integrally forming a unitary heated liner, wherein each of the plurality of cylindrical contact pads contacts a portion of the chamber lid, and at least one groove is disposed on a side of the ceramic body opposite to the plurality of cylindrical contact pads wherein the plurality of cylindrical contact pads minimize a contact area between the chamber lid and the liner assembly.

13. A processing chamber, comprising:

a chamber body having sidewalls, a bottom, and a chamber lid coupled to a top portion of the chamber body, defining one or more processing regions therein; and a liner assembly, comprising:

a heater liner removably disposed between a pumping liner and sidewalls of the processing chamber;

a flange extending outward from an outer diameter of the heater liner, wherein the flange has an annular groove formed therein and a portion of an upper surface of the flange forms a sealing surface; and     a plurality of cylindrical contact pads extending from the upper surface of the flange, wherein each of the plurality of cylindrical contact pads contacts a portion of the chamber lid, and wherein the annular groove is disposed on a side of the heater liner opposite to the plurality of cylindrical contact pads and the heater liner, the flange and the plurality of cylindrical contact pads integrally forming a unitary heater liner body wherein the plurality of cylindrical contact pads minimize a contact area between the chamber lid and the liner assembly.

14. The processing chamber of claim 1, wherein the sealing surface is maintained spaced from the chamber lid by the plurality of cylindrical contact pads.

15. The processing chamber of claim 12, wherein the sealing surface is maintained spaced from the chamber lid by the plurality of cylindrical contact pads.

16. The processing chamber of claim 13, wherein the sealing surface is maintained spaced from the chamber lid by the plurality of cylindrical contact pads.

\* \* \* \* \*